United States Patent
Chen et al.

(10) Patent No.: US 7,554,836 B2
(45) Date of Patent: Jun. 30, 2009

(54) DATA WRITE IN CONTROL CIRCUIT FOR TOGGLE MAGNETIC RANDOM ACCESS MEMORY

(75) Inventors: Young-Shying Chen, Hsinchu (TW); Chung-Chih Wang, Hsinchu (TW); Chia-Pao Chang, Hsinchu (TW); Chien-Chung Hung, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 24 days.

(21) Appl. No.: 11/966,240

(22) Filed: Dec. 28, 2007

(65) Prior Publication Data

US 2009/0010087 A1 Jan. 8, 2009

(30) Foreign Application Priority Data

Jul. 2, 2007 (TW) .............. 96124053 A

(51) Int. Cl.
G11C 17/00 (2006.01)
(52) U.S. Cl. .............. 365/158; 365/189.07; 365/189.16; 365/171
(58) Field of Classification Search ............ 365/189.17, 365/209
See application file for complete search history.

(56) References Cited

U.S. PATENT DOCUMENTS 6,504,750 B1 * 1/2003 Baker .................. 365/148
2009/0010088 A1 * 1/2009 Chen et al. .................. 365/209

OTHER PUBLICATIONS

Noboru Sakimura et al., A 512Kb Cross-Point Cell MRAM, ISSCC/2003/Session 16/Non-Volatile Memory/Paper 16.1, 2003 IEEE International Solid-State Circuits Conference, 8 pages, 2003.
Gitae Jeong et al., A. 0.24-um 2.0-V 1T1MTJ 16-kb Nonvolatile Magnetoresistance RAM With Self-Reference Sensing Scheme, IEEE Journal of Solid Circuits, Nov. 2003, 1906-1910, vol. 38, No. 11.

* cited by examiner

Primary Examiner—Tan T. Nguyen
(74) Attorney, Agent, or Firm—Workman Nydegger

(57) ABSTRACT

A data write in control circuit for magnetic random access memory is configured with a first transistor, a second transistor connected to the first transistor, a transmission gate connected to the first transistor, a comparator having two input terminal connected to the first transistor, a storage capacitor having one end connected to the first transistor and the other end connected to a power source or a ground, and a logic circuit having one end connected to the output terminal of the comparator and the other end receiving data to be written in.

9 Claims, 9 Drawing Sheets

DATA WRITE IN CONTROL CIRCUIT FOR TOGGLE MAGNETIC RANDOM ACCESS MEMORY

CROSS-REFERENCE TO RELATED APPLICATIONS

This non-provisional application claims priority under 35 U.S.C. § 119(a) on Patent Application No(s). 096124053 filed in Taiwan, R.O.C. on Jul. 2, 2007, the entire contents of which are hereby incorporated by reference.

BACKGROUND

1. Field of Invention

The invention relates to a method for data write-in for a toggle magnetic tunnel junction (MTJ) element, and in particular to a data write-in control circuit for accessing magnetic random access memory by way of self-reference

2. Related Art

The magnetic random access memory (MRAM) is a kind of non-volatile memory, and is used to store and record the data by making use of its electric resistance characteristics, thus having the advantages of non-volatility, high density, high read/write speed, and radiation resistant, etc. The major memory unit of Magnetic Random Access Memory (MRAM) is a magnetic memory unit produced between a write bit line and a write word line, and it is of a stack structure made of multi-layer magnetic metal material, thus it is also referred to as a Magnetic Tunnel Junction (MTJ) element, having a stack structure formed by stacking a soft magnetic layer, a tunnel barrier layer, a hard magnetic layer, and a non-magnetic conduction layer in sequence.

The toggle magnetic tunnel junction (MTJ) element, having the advantages of wide operation range and high heat stability, and thus is well suitable for application in an embedded system.

The memory state of "0" or "1" of MJT element is determined through the parallel or anti-parallel alignment of the magnetic-moment configurations of two layers of ferromagnetic material adjacent to the tunnel barrier layer. As such, the data-write-in is realized through a cross selection of a write bit line and a write word line, wherein, the change of magnetization direction of a memory layer magnetic material is achieved through a magnetic field generated by the current flowing in the write bit line and write word line, so as to change the value of electric resistance, hereby realizing the objective of data-write-in.

Referring to FIG. 1 for a schematic diagram of a structure of an exemplary toggle magnetic tunneling junction (MTJ) element. As shown in FIG. 1, the MTJ element is composed of a anti-ferromagnetic layer 10, a pinned layer 20 formed on anti-ferromagnetic layer 10, a tunnel barrier layer 30 formed on pinned layer 20, and a free layer 40 formed on top of tunnel barrier layer 30. The pinned layer 20 and free layer 40 are both of synthetic anti-ferromagnetic configurations. An upper electrode 51 is formed on top of the freedom layer 40, while a lower electrode 52 is formed below an anti-ferromagnetic layer 10. The upper electrode 51 and lower electrode 52 are connected with a metallic wire, thus forming a route for reading data. Located above and below the upper electrode 51 and the lower electrode 52 are a write bit line (WBL) and write word line (WWL) respectively, as shown in FIG. 2, so that a magnetic field is generated, when a write-in current flows through. In addition, the upper electrode 51 is connected to a read-bit-line (RBL).

The anti-ferromagnetic layer 10 is made of an anti-ferromagnetic material, such as PtMn or IrMn. The pinned layer 20 formed on an anti-ferromagnetic layer 10 is a stack formed by more than one ferromagnetic layers. As shown in FIG. 1, the composite anti-ferromagnetic pinned layer is a three-layer structure formed by stacking ferromagnetic material, non-magnetic metal, and ferromagnetic material sequentially, so that the directions of magnetic moments of the two ferromagnetic layers are in anti-parallel alignment, and it can be made by for example, CoFe/Ru/CoFe, NiFe/Ru/NiFe, or CoFeB/Ru/CoFeB. The tunnel barrier layer 30 formed on pinned layer 20 is made of a material, such as AlOx or MgO. The free layer 40 formed on tunnel barrier layer 30 is a stack of more than one layer of ferromagnetic material, and it can be selected from one of NiFe, CoFe, CoFeB.

In FIG. 1, the pinned layer 20 is a three-layer structure, composed of magnetic layers 21 and 23 made of ferromagnetic material, and a middle layer 22 made of non-magnetic metal. In addition, the free layer 40 is also a three-layer structure, composed of magnetic layers 41 and 43 made of ferromagnetic material, and a middle layer 42 made of non-magnetic metal. The magnetic layers 41 and 43 in free layer 40 each having its respective magnetic moments 61 and 62, and are kept in anti-parallel alignment through coupling of the middle layer 42. The magnetic moments 63 and 64 of the magnetic layers 21 and 23 in pinned layer 20 are kept in anti-parallel alignment. The directions of magnetic moments of magnetic layers 41 and 43 in free layer 40 can rotate freely through applying a magnetic field; while the magnetization directions of magnetic layers 21 and 23 in pinned layer 20 will not rotate through applying a magnetic field, thus serving as a reference layer.

In writing data into memory, the method usually utilized is first selecting a memory unit through the intersection of the induced magnetic fields generated by a write bit line and a write word line, and then changing its value of electric resistance through varying the magnetization direction of the free layer 40. While reading data from memory, current must be supplied to the magnetic memory unit thus selected, and then reading the value of electric resistance in determining the digital value of the data.

Due to the anti-parallel coupling effect between the magnetic layers 41 and 43 of the free layer 40, such that the write-in operation area and sequential introduction write-in manner of toggle MTJ element are as shown in FIGS. 3A & 3B, and is referred to as a first-in first-out mode, namely, the current that is made to conduct and flow first, will be made to stop first. For example, in FIG. 3A, the current IW on a write word line is made to conduct and flow first, then the current IB on a write bit line is made to conduct and flow. Thus, only when the current IW on write word line is made to stop, then the current IB on the write bit line will be made to stop. Conversely, the write operation areas 71 and 73 are as shown in FIG. 3, when the current IW of write word line is first made to conduct and flow, then the magnetic moments 61 and 62 of magnetic layers 41 and 43 will rotate in a clockwise direction 72; and when current IB of write bit line is made to conduct and flow, then the magnetic moments 61 and 62 of magnetic layers 41 and 43 will rotate in a counter-clockwise direction 74.

The rotation of the magnetic moment is unidirectional circulation because of writing waveform for the toggle magnetic memory. Prior to data writing, the stored data is accessed to be compared with the data to be written into the memory. Whether the operation of the data writing is then performed according to the comparison result. This process is called Read-Before-Write (RBW). Therefore, such process decreases the writing speed.

Access by way of self reference is disclosed to improve the writing speed. The memory unit itself is used for self reference. The process involves with recording the voltage or the current in an initial state. Then, the data "0" or "1" is then written into the memory. The voltage or the current in an initial state and that after the data is written is compared. The compared result is then used to determine the data initially stored in the memory. However, the initial data stored in the memory may be changed after access. Thus, the initial data is necessarily restored to the memory.

"A 0.24-um 2.0-V 1T1MTJ 16-kb nonvolatile magnetoresistance RAM with self-reference sensing scheme" disclosed by G. Jeong et.al. in IEEE J. Solid-State Circuits 38 (11), 1906 (2003) and "A 512 Kb Cross-Point Cell MRAM" disclosed by N. Sakimura et.al. in ISSCC Dig. 278 (2003) also disclose data access circuit by way of self reference. However, the data access time is very slow (microsecond level).

SUMMARY OF THE INVENTION

A data write in control circuit for toggle magnetic random access memory is provided to improve the write speed of toggle magnetic random access memory.

In an embodiment, a data write-in control circuit for writing data to a magnetic memory arranged at the across of a first conductive line and a second conductive line is provided. The magnetic memory includes a magnetic tunnel junction (MTJ) element having at least a synthetic anti-ferromagnetic free layer, a tunnel barrier layer, and a synthetic anti-ferromagnetic pinned layer, thus the data stored in the toggle magnetic memory is represented by the resistance dependent on the parallel or anti-parallel alignment of the magnetic moment configurations of two ferromagnetic layers adjacent to the tunnel barrier layer. The data write-in control circuit includes a first transistor; a second transistor connected to the first transistor in series; a transmission gate electrically connected to the first transistor; a comparing circuit having two input ends electrically connected to the first transistor respectively; a storage capacitor with one end electrically connected to the first transistor; and a logic circuit electrically connected to an output end of the comparing circuit.

According to the embodiment, the transmission gate turns on in response to an activating signal at an initial time interval to store an initial state voltage to the storage capacitor. The transmission gate turns off and a first current of the first conductive line at a first time interval is conducted. A second current of the second conductive line at a second time interval is conducted, and the comparing circuit outputs a comparison result according the voltages of the two input ends of the comparing circuit such that the logic circuit outputs a control signal in response to the comparison result from the comparing circuit and a data to be written. The first current of the first conductive line or the second current of the second conductive line is cut off in response to the control signal at a third time interval; and the second current of the second conductive line or the first current of the first conductive line is cut off at a fourth time interval.

In another embodiment, a data write-in control method for writing data to a magnetic memory arranged at the across of a first conductive line and a second conductive line is provided. the magnetic memory includes a magnetic tunnel junction (MTJ) element having at least a synthetic anti-ferromagnetic free layer, a tunnel barrier layer, and a synthetic anti-ferromagnetic pinned layer, thus the data stored in the toggle magnetic memory is represented by the resistance dependent on the parallel or anti-parallel alignment of the magnetic moment configurations of two ferromagnetic layers adjacent to the tunnel barrier layer. The data write-in control circuit includes conducting a first current of the first conductive line at a first time interval; conducting a second current of the second conductive line at a second time interval; comparing a first voltage and a second voltage and outputting a comparison result; performing a logic operation to the comparison result a data to be written in to the magnetic memory and outputting a control signal according to the result of the logic operation; cutting off the first current of the first conductive line or the second current of the second conductive line in response to the control signal at a third time interval; and cutting off the second current of the second conductive line or the first current of the first conductive line at a fourth time interval.

The embodiments of the present invention access data stored in the memory by way of self reference. The embodiments are applicable for writing data into the magnetic memory with the configuration of separate read and write. The data reading operation prior to data writing operation is incorporated into the data writing operation, where is called Read-Within-Write (RWW). Thus, the speed of the writing operation is In addition, the data reading operation is performed by way of self reference, and thus the access error caused by the failure of the reference bit or the resistance variance caused by manufacture parameters are avoided.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will become more fully understood from the detailed description given hereinbelow for illustration only, and thus are not limitative of the present invention, and wherein.

DETAILED DESCRIPTION OF THE INVENTION

The purpose, construction, features, and functions of the invention can be appreciated and understood more thoroughly through the following detailed description with reference to the attached drawings. The purpose of the following preferred embodiments is to describe further the various aspects of the invention, and that is not intended in any way to restrict the scope of the invention.

Figure 4:
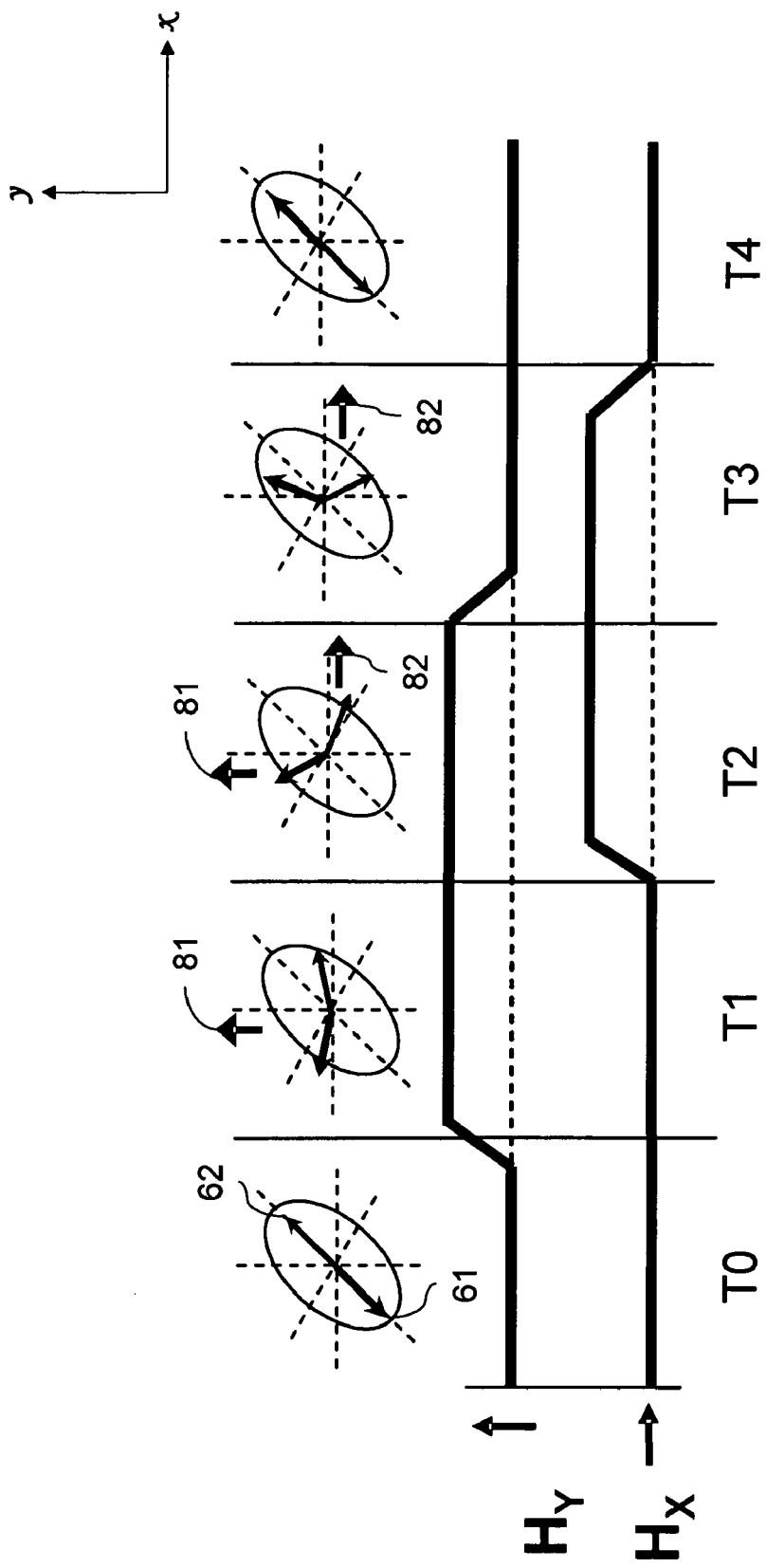
FIG. 4 illustrates the rotation of the magnetic moment of the free layer in the toggle magnetic tunnel junction element in normal state.

The write waveform for the magnetic random access memory is first described for illustration of the embodiment. FIG. 4 illustrates the write-in waveform of a toggle MTJ element.

In time interval T0, the magnetic moments 61 and 62 align with an easy axis of a toggle MTJ element respectively, hereby forming an angle of 45° and 225° with the X axis in the positive direction.

In time interval T1, the write word current is made to conduct and flow, hereby generating a magnetic field 81 along the Y axis in the positive direction, thus making the magnetic moments 61 and 62 start to rotate. The anti-parallel exchange coupling between the magnetic layers 41 and 43 of a free layer 40 will effect the magnetic moments 61 and 62 to rotate a small angle along the direction of the magnetic field. As such, the resultant magnetic moment (not shown) of magnetic moments 61 and 62 aligns in the direction of magnetic field 81, and rotating in a clockwise direction.

In time interval T2, the write bit current is made to conduct and flow, thus generating a magnetic field 82 along X axis in the positive direction. The magnetic field 81 along Y axis and the magnetic field 82 along the X axis, both in the positive directions, will make the resultant magnetic moment rotate further in a clockwise direction, until it roughly align in an anisotropy easy axis direction, and the direction of easy axis is 45° relative to the X axis in the positive direction.

Subsequently, in time interval T3, the write word current is made to stop, so that during T3, only the magnetic field 82 along the X axis in the positive direction remains, thus the resultant magnetic moment will align in the direction of magnetic field 82. At this stage, the rotation of the magnetic moments 61 and 62 have already passed the anisotropy hard axis.

At time interval T4, the write bit current is made to stop, and due to the anti-parallel exchange coupling between the magnetic layers 41 and 43, such that the directions of magnetic moments 61 and 62 align with that of an anisotropy easy axis, hereby indicating an anti-parallel arrangement to achieve the minimum energy state. Taking magnetic moment 61 as an example, at time interval T4, the direction of magnetic moment 61 is aligned with an anisotropy easy axis having an angle of 45°. Compared with its initial angle of 225° at time interval T0, the difference of 180° indicates that the state of magnetic moment 61 has been inverted. Thus, in case that at time interval T0, the logic states of magnetic moments 61 and 62 are defined as "1", then at time interval T4, the logic states of magnetic moments 61 and 62 are defined as "0".

In the above analyses, clockwise rotation is utilized to describe the sequential write mode of the toggle MTJ element of the invention. However, it is possible to make the write word current and the write bit current flow in opposite directions, so that magnetic moments 61 and 62 rotate in a counter-clockwise direction, hereby inverting the state of memory.

In the above time sequence of from time interval T0 to time interval T4, the write word current is first made to conduct and flow, next the write bit current is made to conduct and flow, then the write word current is made to stop, and finally the write bit current is made to stop, thus this kind of timing mode is referred to as a first-in-first-out mode.

Figure 5:
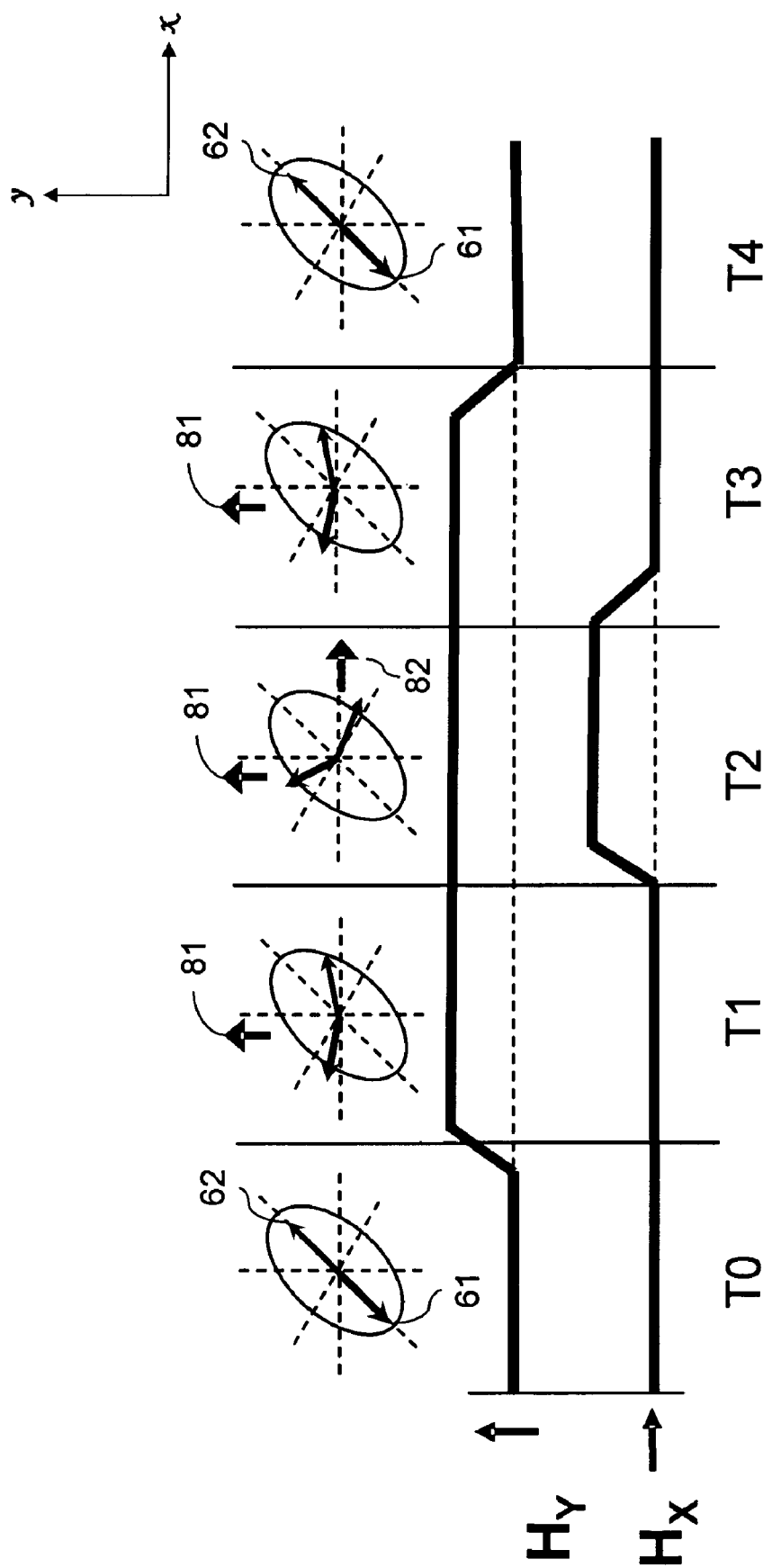
FIG. 5 illustrates the rotation of the magnetic moment of the free layer in the toggle magnetic tunnel junction element in error state.

FIG. 5 illustrates another waveform of the toggle MTJ element. The waveforms for write in data at time interval T0 to T3 are the same as those in FIG. 4. At time interval T3, the write word current continues being applied. The write bit current is cut off. Therefore, only magnetic field 81 along the Y axis in the positive direction exists. The rotation of the magnetic moments 61 and 62 pass the anisotropy hard axis again counterclockwise. Thus, the angles of the magnetic moments 61 and 62 with the X axis return to those at the time interval T1. In time interval T4, the write word current is cut off. In this stage, the anti-parallel exchange coupling between the magnetic layers 41 and 43 of a free layer 40 make the magnetic moments 61 and 62 rotate to the original direction.

The waveforms in FIG. 4 enable the magnetic moment in the free layer rotate to another stable direction, which represents data write in. However, in FIG. 5, the magnetic moment in the free layer rotates to the middle sate, and returns to the direction of the time interval T1 at the time interval T3, which represents writing failure. It is appreciated from FIGS. 4 and 5 that the magnetic moment in the free layer rotates to the middle sate. Therefore, data stored in the memory may be determined by the resistance variation when the magnetic moment in the free layer is in the initial state and in the middle state. This refers to self reference. In the configuration of separate reading and writing, the write bit line and the read bit line are separate. Therefore, the resistance of the MTJ element may be obtained when writing data.

Figure 6:
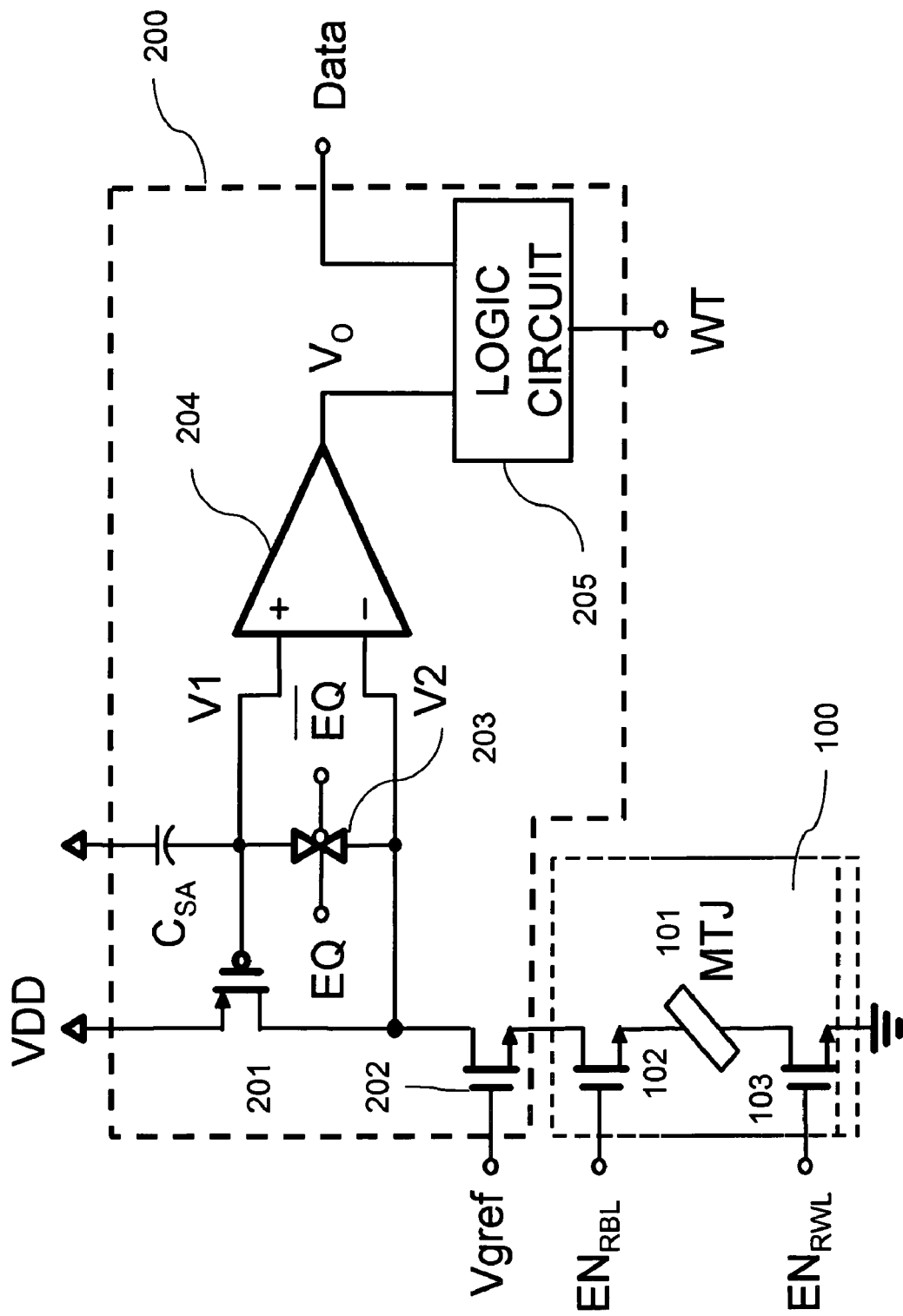
FIG. 6 illustrates the data write in control circuit of the toggle magnetic random access memory according to the embodiment of the invention.

FIG. 6 illustrates the data write in control circuit of the toggle magnetic random access memory according to the embodiment of the invention. Data is written into a toggle magnetic memory by way of self reference.

Figure 1:
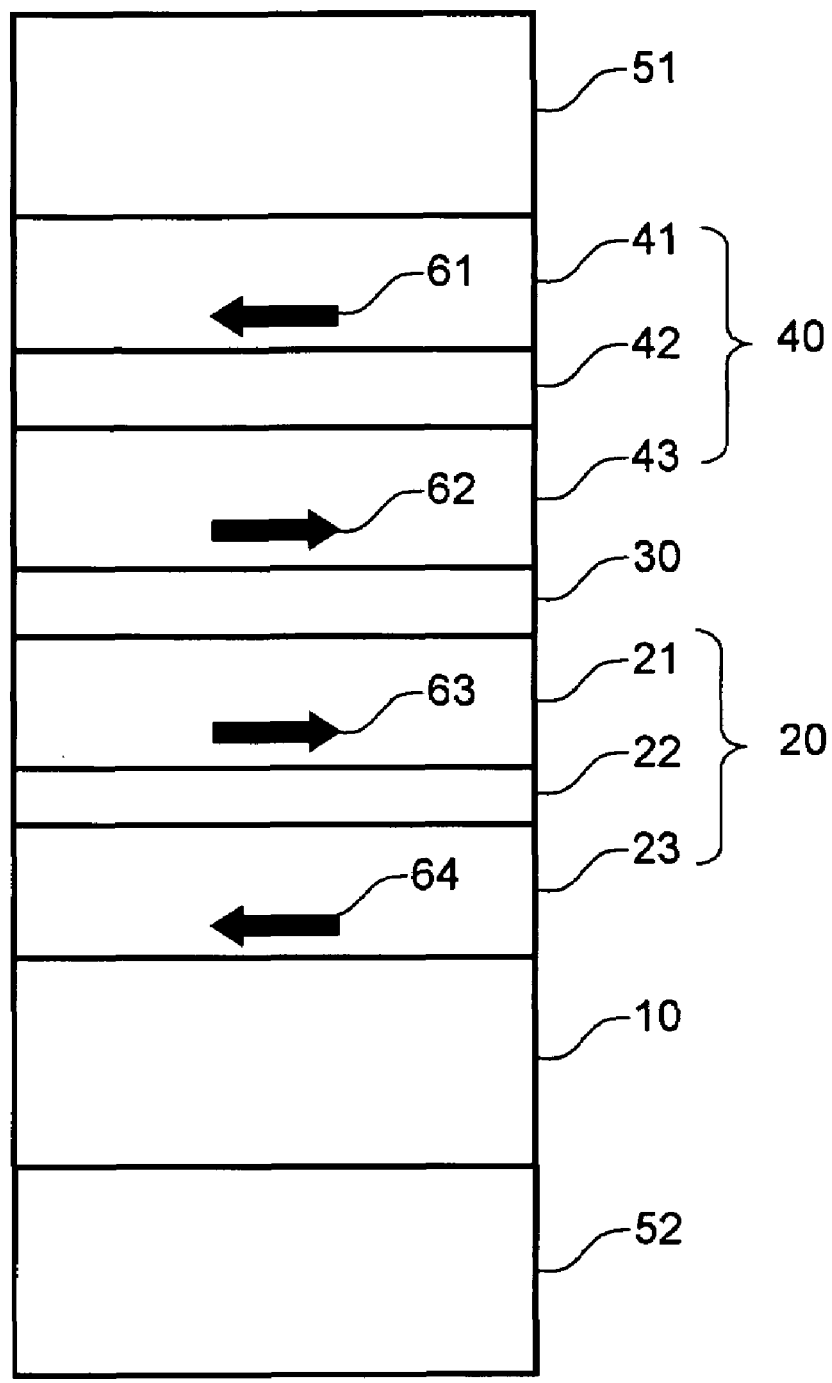
FIG. 1 is a schematic diagram of a structure of a toggle magnetic tunnel junction (MTJ) element of the prior art.
Figure 2:
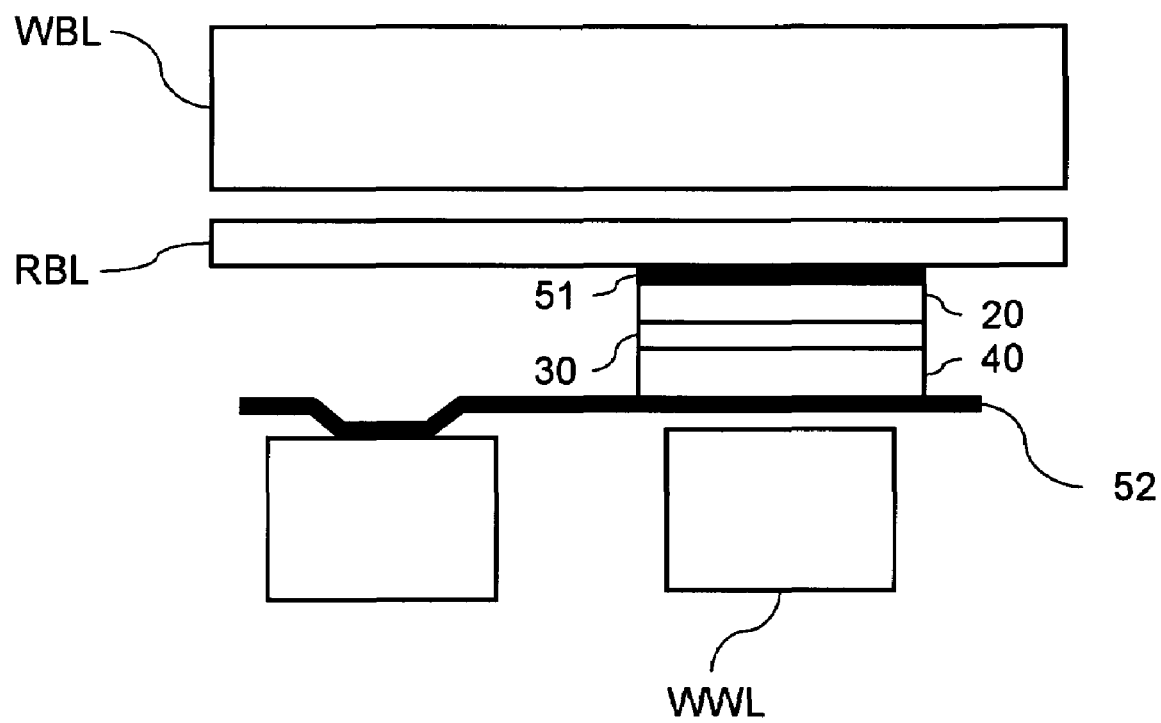
FIG. 2 is a schematic diagram of a structure of a magnetic random access memory (MRAM) of the prior art.
Figure 3:
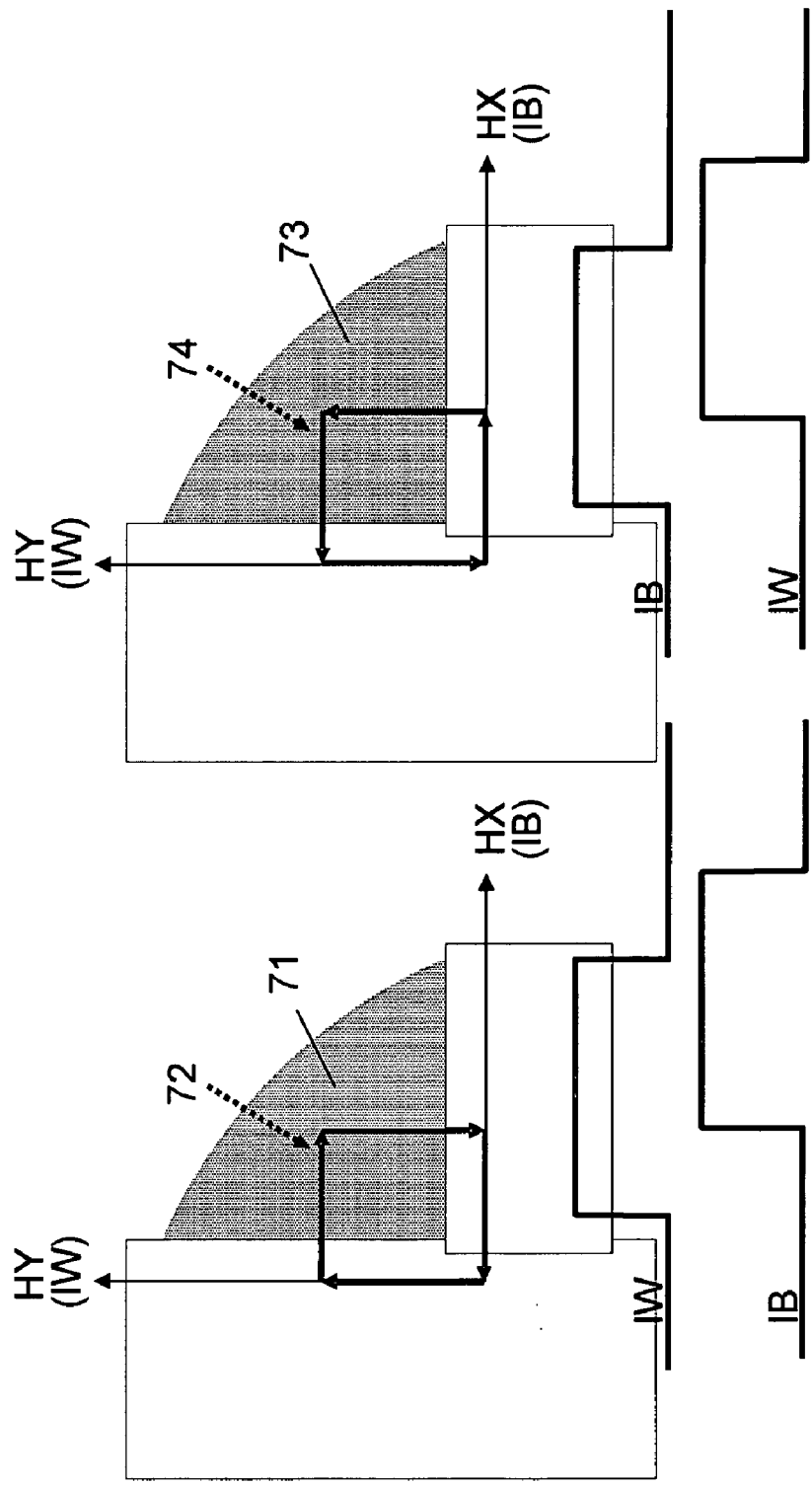
FIGS. 3A-3B are the schematic diagrams of a operation area and write sequence of a toggle magnetic tunnel junction (MTJ) element of the prior art.

The magnetic memory is arranged at the across of a first conductive line and a second conductive line, such as write bit line (WBL) and write word line (WWL) as shown in FIG. 2. The magnetic memory includes a magnetic tunneling junction (MTJ) element. The MTJ element is composed of a synthetic anti-ferromagnetic free layer, a tunnel barrier layer, and a synthetic anti-ferromagnetic pinned layer as shown in FIG. 2. The data stored in the toggle magnetic memory is represented by the resistance dependent on the parallel or anti-parallel alignment of the magnetic moment configurations of two ferromagnetic layers adjacent to the tunnel barrier layer. The magnetic moment configurations of two ferromagnetic layers represent an initial state at an initial state.

The write in control circuit 200 controls the date to be written in to the memory unit 100. The memory unit 100 includes a MTJ element 101, a first switch 102 and a second switch 103. In the configuration of separate read and write, the MTJ element 101 can be a Wiggle MTJ or a Toggle MTJ.

The first switch 102 and the second switch 103 are controlled to select the memory unit 100. In one embodiment, the first switch 102 and the second switch 103 may be a NMOS. In the exemplary embodiment, the gate terminal of the first switch 102 receives an enabling signal of the write bit line $EN_{RBL}$. The gate terminal of the second switch 103 receives an enabling signal of the write word line $EN_{RWL}$.

The control circuit 200 is configured with a first transistor 201, a second transistor 202, a transmission gate 203, a comparing circuit 204, a storage capacitor $C_{SA}$ and a logic circuit 205.

The first transistor 201 is exemplarily a PMOS. The second transistor 202 is exemplarily a NMOS. The first transistor 201 and the second transistor 202 are connected in series. The two terminals of the transmission gate are connected to the gate terminal and the drain terminal of the first transistor 201 respectively. One terminal of the storage capacitor $C_{SA}$ is electrically connected to the gate terminal of the first transistor 201. The other terminal of the storage capacitor $C_{SA}$ is electrically connected to a power source VDD. The output terminal of the comparing circuit 204 is electrically connected to the logic circuit 205. The input terminal of the comparing circuit 204 is electrically connected to the drain terminal of the first transistor 201.

Figure 7:
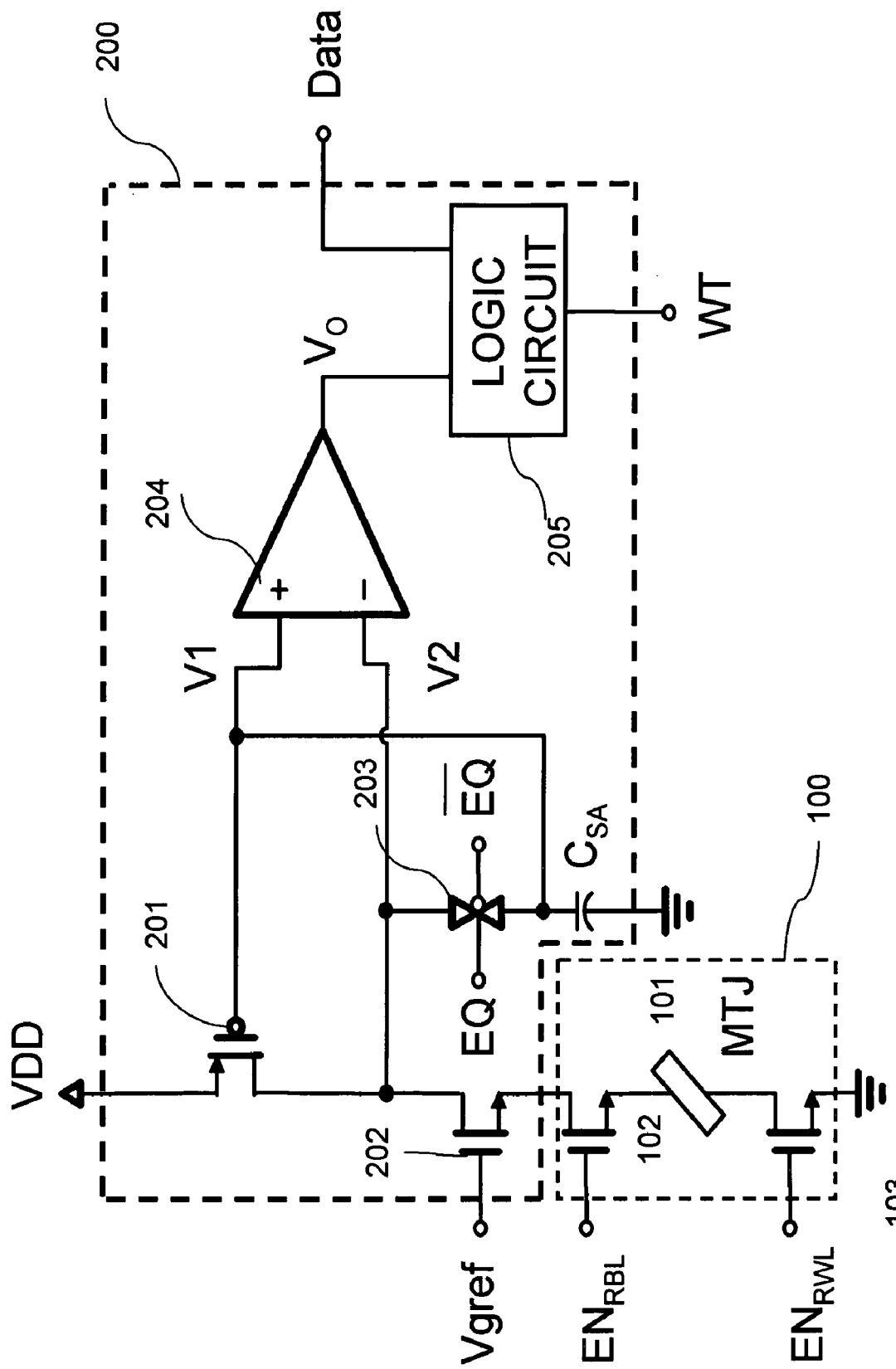
FIG. 7 illustrates another data write in control circuit of the toggle magnetic random access memory according to the embodiment of the invention.

FIG. 7 illustrates another data write in control circuit of the toggle magnetic random access memory according to the embodiment of the invention. In the embodiment of FIG. 7, One terminal of the storage capacitor $C_{SA}$ is electrically connected to the gate terminal of the first transistor 201. The other terminal of the storage capacitor $C_{SA}$ is electrically connected to a gourd.

When the first switch 102 receives the enabling signal of the write bit line $EN_{RBL}$ and the second switch 103 receives the enabling signal of the write word line $EN_{RWL}$ at an initial time, the activating signal EQ is generated for balance of voltage level. The transmission gate 203 turns on in response to the activating signal such that an initial-state voltage is stored to the storage capacitor $C_{SA}$.

In time interval T1, the activating signal EQ is turned off such that the transmission gate 203 turns off. The storage capacitor $C_{SA}$ stores the initial-state voltage at present. The bias voltage of the first transistor 201 is maintained because of the voltage stored in the storage capacitor $C_{SA}$.

In time interval T1, a first current in the first conductive line is conducted. In time interval T2, a second current in the second conductive line is conducted. The comparing circuit 204 compares the voltages at the node V2 and the node V1 and outputs the voltage as a logic "0" or logic "1".

The logic circuit 205 performs a logic operation to a data to be written and the output Vo of the comparing circuit 305 and outputs a control signal WT for use in time interval T3 accordingly. When the MTJ element 101 is a wiggle type element, the logic circuit performs a XOR operation to the data to be written and the output of the comparing circuit 204. When the MTJ element 101 is a toggle type element, the logic circuit performs a XNOR operation to the data to be written and the output of the comparing circuit 204. In another embodiment, the logic circuit may be configured with a XOR logic or a XNOR logic to perform the operation.

The first current of the first conductive line is cut off in response to the control signal WT at the third time interval T3 in response to the control signal WT. Then the second current of the second conductive line is cut off at the fourth time interval T4.

Alternatively, the second current of the second conductive line is cut off in response to the control signal WT at the third time interval T3 in response to the control signal WT. Then the first current of the first conductive line is cut off at the fourth time interval T4.

Figure 8A:
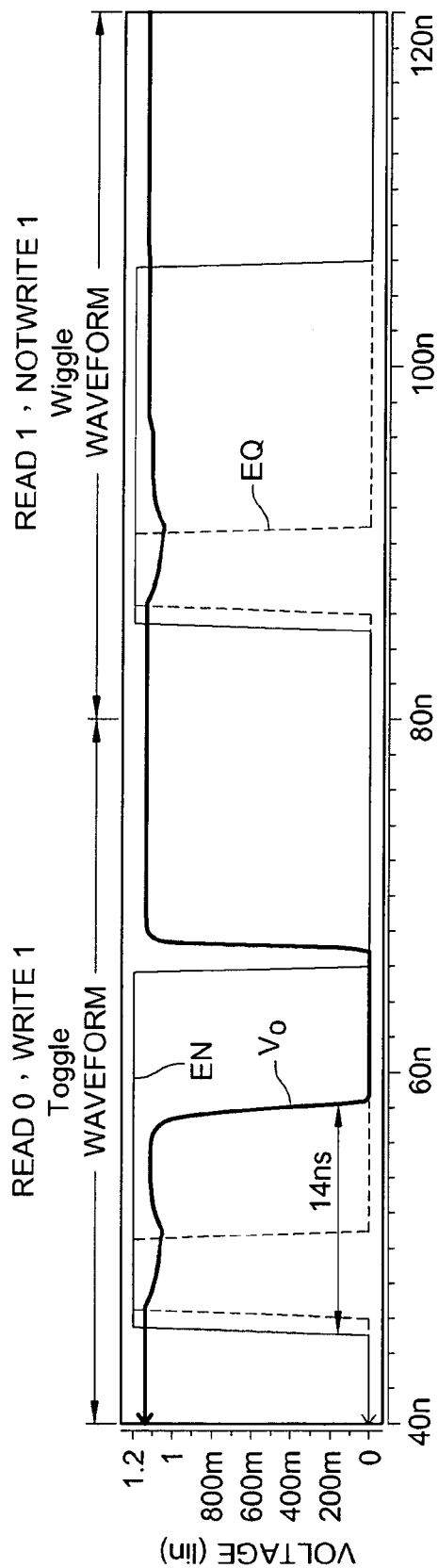
FIGS. 8A to 8C are the simulation of the data write in control circuit of the toggle magnetic random access memory.
Figure 8B:
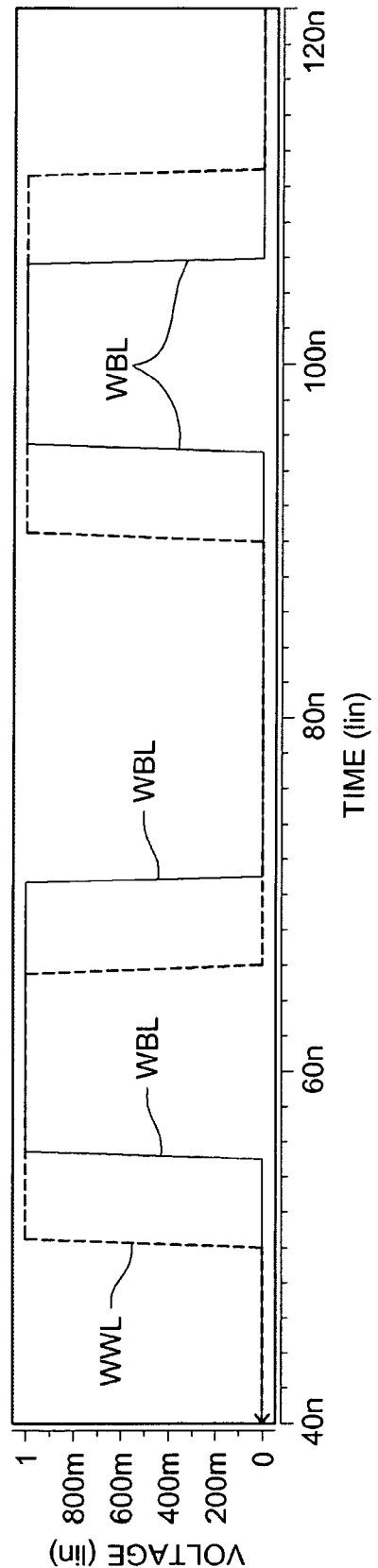
Figure 8C:
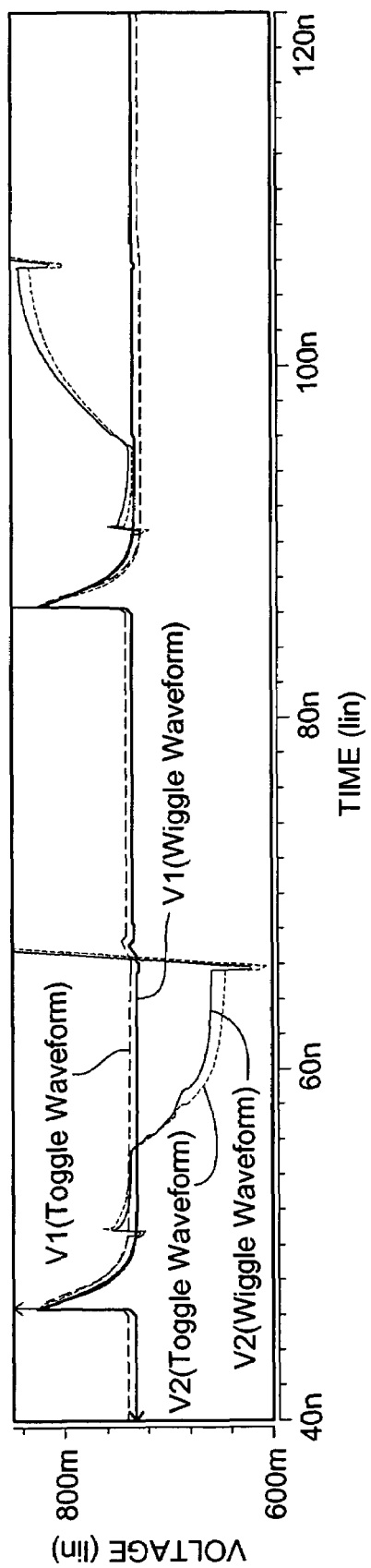

FIGS. 8A to 8C are the simulation of the data write in control circuit of the toggle magnetic random access memory. The simulation is performed by the simulation circuit disclosed in the Taiwan patent application no. 96123875 and by the 0.15 um CMOS model developed by Taiwan Semiconductor Manufacturing Company Limited. The data "1" is written for two times in the simulation. The toggle type MTJ and the wiggle type MTJ are employed for simulation. In the data writing process, the data access time is around 14 ns since the data access is performed in the data writing process. Thus, the operation time may be reduced due to data access during data being written into the memory.

The embodiments of the present invention access data stored in the memory by way of self reference. The embodiments are applicable for writing data into the magnetic memory with the configuration of separate read and write. The data reading operation prior to data writing operation is incorporated into the data writing operation, where is called reading within writing. Thus, the speed of the writing operation is In addition, the data reading operation is performed by way of self reference, and thus the resistance variance and unevenness of the magnetoresistance (MR) ratio caused by manufacture parameters are avoided. The circuit stability is also increased.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A data write-in control circuit for writing data to a magnetic memory arranged at the across of a first conductive line and a second conductive line, the magnetic memory comprising a magnetic tunnel junction (MTJ) element having at least a synthetic anti-ferromagnetic free layer, a tunnel barrier layer, and a synthetic anti-ferromagnetic pinned layer, thus the data stored in the toggle magnetic memory is represented by the resistance dependent on the parallel or anti-parallel alignment of the magnetic moment configurations of two ferromagnetic layers adjacent to the tunnel barrier layer, the data write-in control circuit comprising:
   a first transistor;
   a second transistor connected to the first transistor in series;
   a transmission gate electrically connected to the first transistor;
   a comparing circuit having two input ends electrically connected to the first transistor respectively;
   a storage capacitor with one end electrically connected to the first transistor; and
   a logic circuit electrically connected to an output end of the comparing circuit;
   wherein the transmission gate turns on in response to an activating signal at an initial time interval to store an initial state voltage to the storage capacitor;
   the transmission gate turning off and conducting a first current of the first conductive line at a first time interval;
   conducting a second current of the second conductive line at a second time interval, and the comparing circuit outputting a comparison result according the voltages of the two input ends of the comparing circuit such that the logic circuit outputs a control signal in response to the comparison result from the comparing circuit and a data to be written;
   cutting off the first current of the first conductive line or the second current of the second conductive line in response to the control signal at a third time interval; and
   cutting off the second current of the second conductive line or the first current of the first conductive line at a fourth time interval.

2. The circuit as claimed in claim 1, wherein the comparing circuit comprises a comparator having a first and a second input terminal, wherein the gate terminal of the first transistor is connected to the first input terminal of the comparator, and the drain terminal of the transistor is connected to the second input terminal of the comparator.

3. The circuit as claimed in claim 1, wherein the logic circuit comprises a XOR logic when the magnetic memory comprises a toggle magnetic tunnel junction element.

4. The circuit as claimed in claim 1, wherein the logic circuit comprises a XNOR logic when the magnetic memory comprises a wiggle magnetic tunnel junction element.

5. The circuit as claimed in claim 1, wherein the other end of the storage capacitor is electrically connected to a power source or a ground.

6. A data write-in control method for writing data to a magnetic memory arranged at the across of a first conductive line and a second conductive line, the magnetic memory comprising a magnetic tunnel junction (MTJ) element having at least a synthetic anti-ferromagnetic free layer, a tunnel barrier layer, and a synthetic anti-ferromagnetic pinned layer, thus the data stored in the toggle magnetic memory is represented by the resistance dependent on the parallel or anti-parallel alignment of the magnetic moment configurations of two ferromagnetic layers adjacent to the tunnel barrier layer, the data write-in control circuit comprising:

conducting a first current of the first conductive line at a first time interval;

conducting a second current of the second conductive line at a second time interval;

comparing a first voltage and a second voltage and outputting a comparison result;

performing a logic operation to the comparison result a data to be written in to the magnetic memory and outputting a control signal according to the result of the logic operation;

cutting off the first current of the first conductive line or the second current of the second conductive line in response to the control signal at a third time interval; and cutting off the second current of the second conductive line or the first current of the first conductive line at a fourth time interval.

7. The method of claim 6, further comprises a step of equalizing the voltages at the first input terminal and the second input terminal at an initial time interval and storing an initial state voltage.

8. The method of claim 6, wherein a XOR logic operation is performed when the magnetic memory comprises a toggle magnetic tunnel junction element in the step of performing a logic operation.

9. The method of claim 6, wherein a XNOR logic operation is performed when the magnetic memory comprises a wiggle magnetic tunnel junction element in the step of performing a logic operation.

* * * * *